(12) United States Patent
Kato (10) Patent No.: US 9,986,641 B2
(45) Date of Patent: May 29, 2018

(54) CIRCUIT BOARD

(71) Applicant: Murata Manufacturing Co., Ltd., Nagaokakyo-shi, Kyoto-fu (JP)

(72) Inventor: Noboru Kato, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 2 days.

(21) Appl. No.: 14/817,380

(22) Filed: Aug. 4, 2015

(65) Prior Publication Data

US 2015/0342048 A1    Nov. 26, 2015

Related U.S. Application Data

(63) Continuation of application No. 13/247,031, filed on Sep. 28, 2011, now Pat. No. 9,136,212, which is a
(Continued)

(30) Foreign Application Priority Data

Apr. 2, 2009    (JP) ................................. 2009-089897

(51) Int. Cl.
*H05K 1/11* (2006.01)
*H01L 23/498* (2006.01)
(Continued)

(52) U.S. Cl.
CPC ........ *H05K 1/115* (2013.01); *H01L 23/49822* (2013.01); *H05K 1/0271* (2013.01);
(Continued)

(58) Field of Classification Search
CPC ... H05K 1/00; H05K 1/02; H05K 1/11; H05K 3/00; H05K 3/24; H05K 3/32; H05K 3/34; H05K 3/36; H05K 3/38; H05K 3/40; H05K 3/46; H05K 3/52; H01L 21/00; H01L 21/02; H01L 21/40; H01L 21/50; H01L 21/56; H01L 23/02; H01L 23/10; H01L 23/34; H01L 23/48; H01L 23/52; H01P 3/08

USPC .... 174/254, 126.2, 250, 255, 258–263, 266; 361/728, 760; 257/353, 666, 700, 704, 257/706, 720, 774, 778; 333/238

See application file for complete search history.

(56) References Cited

U.S. PATENT DOCUMENTS 5,818,699 A * 10/1998 Fukuoka ................. H01L 23/10
257/353
5,822,856 A * 10/1998 Bhatt ..................... H05K 1/113
174/262

(Continued)

OTHER PUBLICATIONS

Kato, "Circuit Board", U.S. Appl. No. 13/247,031, filed Sep. 28, 2011.

*Primary Examiner* — Xiaoliang Chen
(74) *Attorney, Agent, or Firm* — Keating & Bennett, LLP (57) ABSTRACT

A circuit board includes a laminated body including a laminate of a plurality of insulating-material layers made of a flexible material. External electrodes are provided on the top surface of the laminated body. An electronic component is mounted on the external electrodes. A plurality of internal conductors, when viewed in plan in the z-axis direction, are overlaid on the external electrodes and are not connected to one another in regions in which the internal conductors are overlaid on the external electrodes.

3 Claims, 9 Drawing Sheets

Related U.S. Application Data continuation of application No. PCT/JP2010/051488, filed on Feb. 3, 2010.

(51) Int. Cl.
*H05K 1/02* (2006.01)
*H05K 1/14* (2006.01)
*H05K 1/16* (2006.01)
*H05K 3/46* (2006.01)

(52) U.S. Cl.
CPC ............ *H01L 2224/05568* (2013.01); *H01L 2224/05573* (2013.01); *H01L 2224/16225* (2013.01); *H01L 2224/16227* (2013.01); *H01L 2924/00014* (2013.01); *H01L 2924/15311* (2013.01); *H05K 1/141* (2013.01); *H05K 1/16* (2013.01); *H05K 3/4632* (2013.01); *H05K 2201/0129* (2013.01); *H05K 2201/0352* (2013.01); *H05K 2201/09672* (2013.01); *H05K 2201/10674* (2013.01)

(56) References Cited

U.S. PATENT DOCUMENTS

| | | | |
|---|---|---|---|
| 5,949,654 A * | 9/1999 | Fukuoka | H01L 21/50 257/700 |
| 6,353,189 B1 * | 3/2002 | Shimada | H01L 21/563 174/255 |
| 7,964,973 B2 * | 6/2011 | Lin | H01L 23/53238 257/738 |
| 2001/0025723 A1 * | 10/2001 | Kondo | H01L 23/49816 174/260 |
| 2001/0027875 A1 * | 10/2001 | Kim | H05K 3/4623 174/255 |
| 2003/0011999 A1 * | 1/2003 | Urakawa | H01L 23/49838 361/728 |
| 2003/0056980 A1 * | 3/2003 | Takeuchi | B26F 1/02 174/255 |
| 2003/0116348 A1 * | 6/2003 | Nakatani | H01G 9/26 174/260 |
| 2003/0173105 A1 * | 9/2003 | Kondo | H05K 3/4691 174/255 |
| 2004/0035520 A1 * | 2/2004 | Nakamura | H05K 3/4617 156/182 |
| 2004/0099958 A1 * | 5/2004 | Schildgen | H01L 23/49894 257/778 |
| 2004/0140571 A1 * | 7/2004 | Tomura | H01L 23/498 257/778 |
| 2004/0142155 A1 * | 7/2004 | Yokota | B32B 15/08 428/209 |
| 2006/0016620 A1 * | 1/2006 | Miyazaki | H05K 3/4038 174/262 |
| 2007/0029109 A1 * | 2/2007 | Miyazaki | H05K 3/4038 174/262 |
| 2007/0080447 A1 * | 4/2007 | Hasebe | H01L 23/142 257/706 |
| 2007/0084630 A1 * | 4/2007 | Cho | H05K 3/4007 174/262 |
| 2007/0107930 A1 * | 5/2007 | Yamamoto | H05K 3/281 174/255 |
| 2008/0014768 A1 * | 1/2008 | Lee | H05K 3/429 439/77 |
| 2008/0172867 A1 * | 7/2008 | Tsurusaki | H05K 3/381 29/830 |
| 2008/0289853 A1 * | 11/2008 | Sakai | H01L 23/49822 174/126.2 |
| 2009/0021446 A1 * | 1/2009 | Kataya | G06K 19/07749 343/860 |
| 2009/0160719 A1 * | 6/2009 | Kato | G06K 19/07749 343/742 |
| 2009/0314523 A1 * | 12/2009 | Ito | B32B 17/04 174/254 |
| 2011/0120754 A1 * | 5/2011 | Kondo | H01L 23/14 174/254 |
| 2014/0176264 A1 * | 6/2014 | Tago | H05K 1/0225 333/238 |
| 2014/0184360 A1 * | 7/2014 | Kato | H05K 1/0253 333/238 |

* cited by examiner

CIRCUIT BOARD

BACKGROUND OF THE INVENTION

1. Field of the Invention

The present invention relates to circuit boards, and more particularly, to a circuit board on which an electronic component is to be mounted.

2. Description of the Related Art

Figure 10:
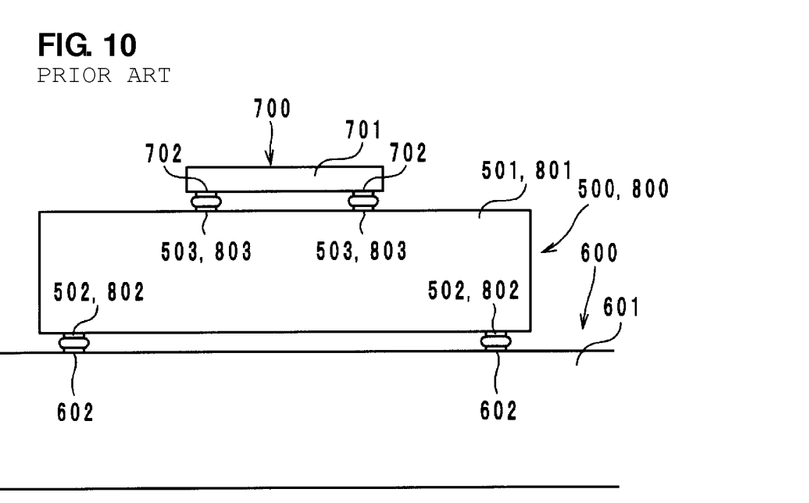
FIG. 10 is a diagram illustrating a conventional circuit board mounted on a printed wiring board.

Circuit boards including laminates of ceramic layers are known as conventional general circuit boards. FIG. 10 is a diagram illustrating a conventional circuit board 500 mounted on a printed wiring board 600. In addition, an electronic component 700 is mounted on the circuit board 500.

As illustrated in FIG. 10, the circuit board 500 is composed of a main body 501 and external electrodes 502 and 503. The main body 501 is composed of a laminate of ceramic layers and is a rigid board. The external electrodes 502 and 503 are provided on a top surface and a bottom surface, respectively, of the main body 501.

The printed wiring board 600 is a motherboard mounted on, for example, an electronic device, such as a mobile phone, and is provided with a main body 601 and external electrodes 602, as illustrated in FIG. 10. The main board is a rigid board made of resin or the like. The external electrodes 602 are provided on a top surface of the main body 601.

The electronic component 700 is, for example, a semiconductor integrated circuit and is provided with a main body 701 and external electrodes 702. The main body 701 is a semiconductor board. The external electrodes 702 are provided on the bottom surface of the main body 701.

As illustrated in FIG. 10, the circuit board 500 is mounted on the printed wiring board 600. Specifically, the circuit board 500 is mounted by connecting the external electrodes 502 to the external electrodes 602 by solder.

As illustrated in FIG. 10, the electronic component 700 is mounted on the circuit board 500. Specifically, the electronic component 700 is mounted by connecting the external electrodes 503 to the external electrodes 702 by solder. The circuit board 500, the printed wiring board 600, and the electronic component 700 described above are to be mounted in an electronic device, such as a mobile phone.

Meanwhile, the conventional circuit board 500 has a problem in that it is likely to be detached from the printed wiring board 600. More specifically, it is likely that the printed wiring board 600 is bent by shock generated when the electronic component containing the circuit board 500 and the printed wiring board 600 is dropped. Even if the printed wiring board 600 is bent, the circuit board 500 may not be bent significantly along with the bending of the printed wiring board 600 since the circuit board 500 is a rigid board. Thus, stress is imposed on the solder connecting the external electrodes 502 to the external electrodes 602. As a result, the solder is broken, and the circuit board 500 is detached from the printed wiring board 600.

To overcome the above problem, the circuit board 500 may be fabricated by laminating sheets made of a flexible material. A printed circuit board disclosed in Japanese Unexamined Patent Application Publication No. 2006-93438, for example, includes a laminate of sheets made of a flexible material. FIG. 10 is used as a reference of a configuration of a printed board 800.

The printed board 800 disclosed in Japanese Unexamined Patent Application Publication No. 2006-93438 includes a main body 801 and external electrodes (lands) 802 and 803. The main body 801 is composed of a laminate of sheets made of thermoplastic resin. The external electrodes 802 and 803 are provided on the top surface and the bottom surface, respectively, of the main body 801. Similarly to the circuit board 500, the printed board 800 is mounted on the printed wiring board 600 through the external electrodes 802 on the bottom surface. Similarly to the circuit board 500, the electronic component 700 is mounted on the printed board 800 through the external electrodes 803 on the top surface.

However, in the printed board 800 disclosed in Japanese Unexamined Patent Application Publication No. 2006-93438, the electronic component 700 is likely to be detached. Specifically, the printed board 800 can be bent since it is composed of sheets made of a flexible material. Thus, if the printed wiring board 600 is bent, the printed board 800 can be bent along with the bending of the printed wiring board 600. Thus, it is possible to prevent the printed board 800 from being detached from the printed wiring board 600 due to breakage of solder connecting the external electrodes 602 and the external electrodes 802. Meanwhile, the printed board 800 has flexibility over its entire surface, and thus, the entire surface of the printed board 800 can be bent. On the other hand, the electronic component 700 is composed of a semiconductor board and, thus, cannot be bent significantly. Thus, stress is imposed on the external electrodes 702 and 803 and the solder connecting the external electrodes 702 and 803. As a result, the solder may be broken, and the external electrodes 702 and 803 may be detached from the main bodies 701 and 801. That is, the electronic component 700 and the printed board 800 may be disconnected.

In FIG. 10, the printed board 800 is attached to the printed wiring board 600 through the external electrodes 802. However, in a case in which the printed board 800 is attached to a casing by an adhesive or other material, the problem of possible disconnection between the electronic component 700 and the printed board 800 may also occur.

SUMMARY OF THE INVENTION

To overcome the problems described above, preferred embodiments of the present invention provide a circuit board which prevents an electronic component from being detached from the circuit board.

A circuit board according to a preferred embodiment of the present invention preferably includes a laminated body including a laminate of a plurality of insulating-material layers made of a flexible material, a first external electrode which is provided on a top surface of the laminated body and on which an electronic component is to be mounted, and a plurality of internal conductors which, when viewed in plan in a lamination direction, are overlaid on the first external electrode and are not connected to one another through via hole conductors in a region in which the internal conductors are overlaid on the first external electrode.

According to various preferred embodiments of the present invention, an electronic component is prevented from being detached from a circuit board.

The above and other elements, features, steps, characteristics, and advantages of the present invention will become more apparent from the following detailed description of the preferred embodiments with reference to the attached drawings.

DETAILED DESCRIPTION OF THE PREFERRED EMBODIMENTS

In the following, a circuit board according to preferred embodiments of the present invention will be described with reference to the drawings.

Figure 1:
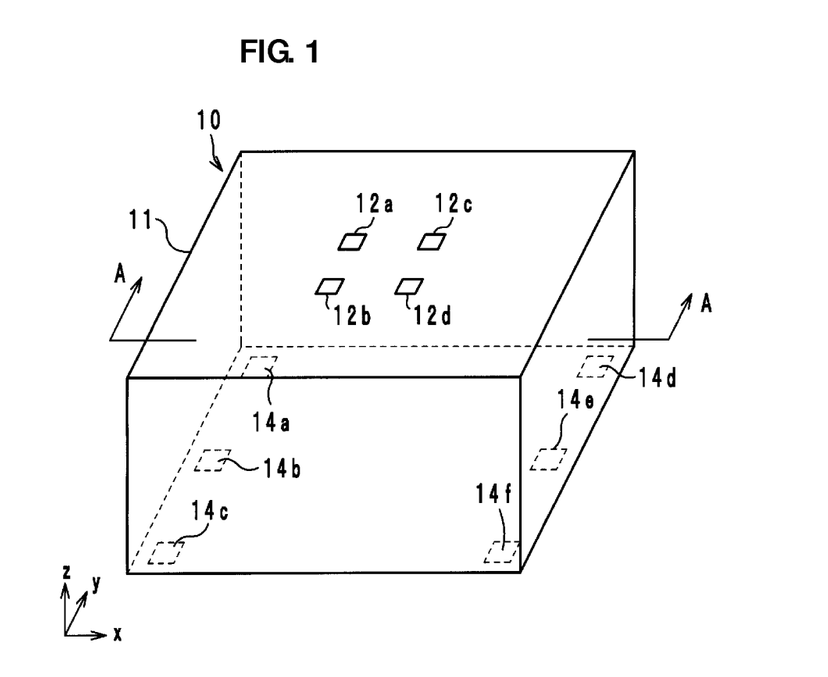
FIG. 1 is an external perspective view of a circuit board according to a preferred embodiment of the present invention.
Figure 2:
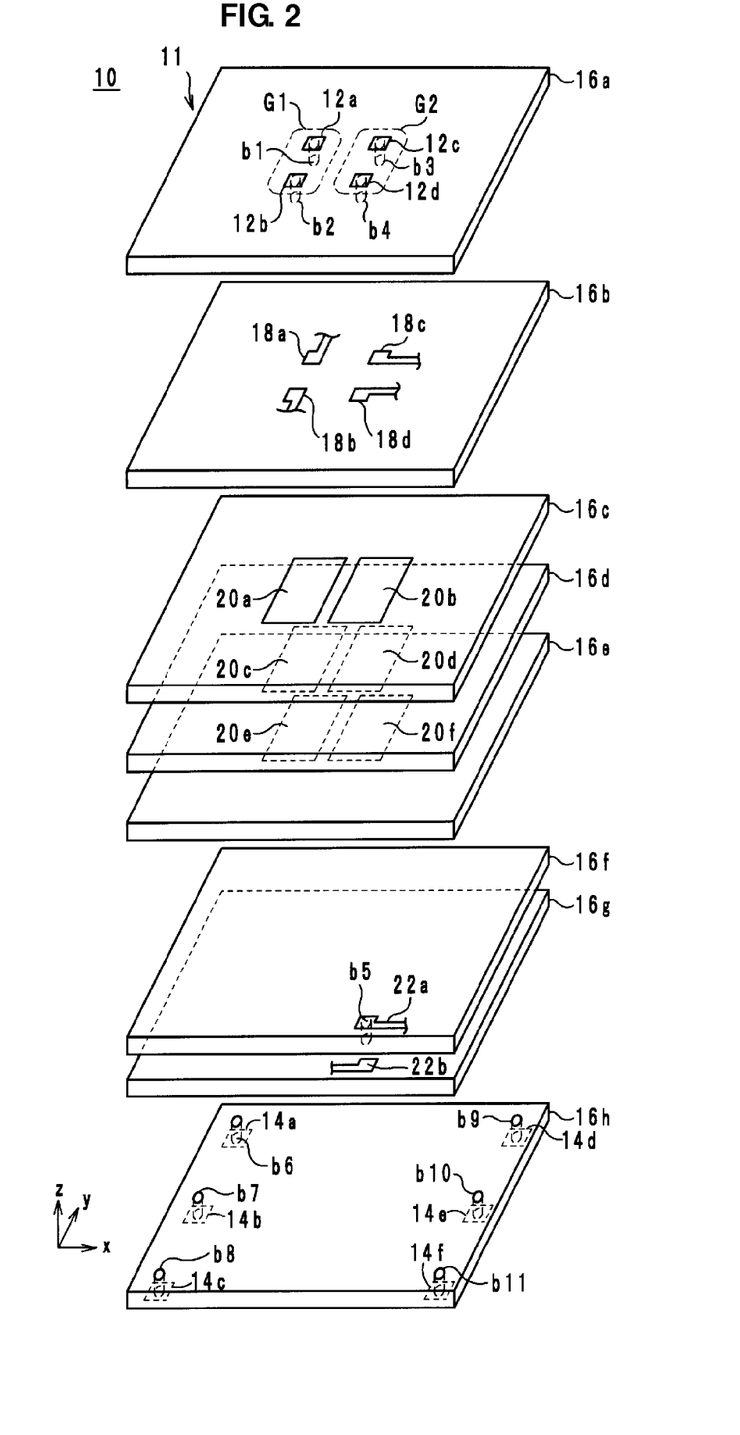
FIG. 2 is an exploded perspective view of the circuit board in FIG. 1.
Figure 3:
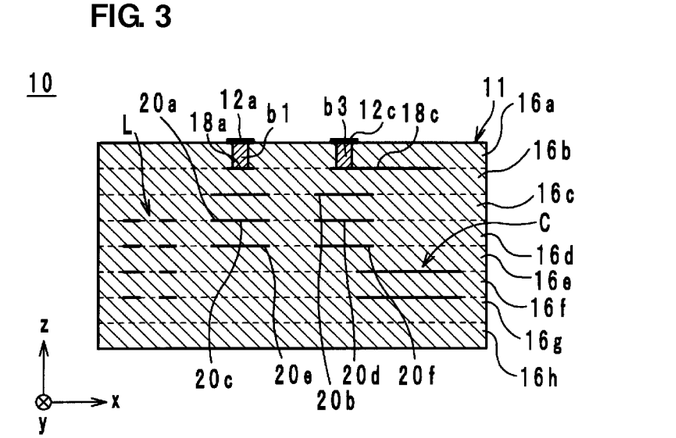
FIG. 3 is a cross-sectional structural view of the circuit board in FIG. 1 which is taken along line A-A.
Figure 4:
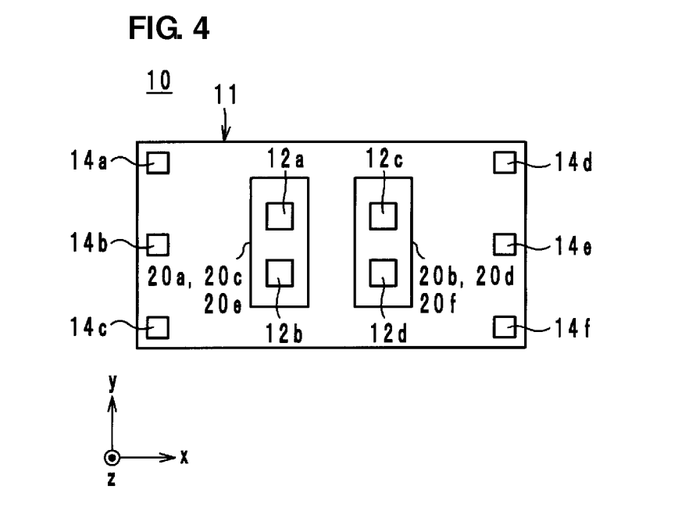
FIG. 4 is a perspective view of the circuit board in FIG. 1 viewed in the lamination direction.

In the following, a configuration of a circuit board according to preferred embodiments of the present invention will be described with reference to the drawings. FIG. 1 is an external perspective view of a circuit board 10 according to a preferred embodiment of the present invention. FIG. 2 is an exploded perspective view of the circuit board 10 in FIG. 1. FIG. 3 is a cross-sectional structural view of the circuit board 10 in FIG. 1 which is taken along line A-A. FIG. 4 is a perspective view from a lamination direction of the circuit board 10 in FIG. 1. In FIGS. 1 to 4, a lamination direction is defined as a direction in which insulating-material layers are laminated during fabrication of the circuit board 10. The lamination direction is referred to as a z-axis direction. A direction along the long sides of the circuit board 10 is referred to as an x-axis direction, and a direction along the short sides of the circuit board 10 is referred to as a y-axis direction. Further, in the circuit board 10, a surface at the forward side in the z-axis direction is referred to as a top surface, a surface at the rearward side in the z-axis direction is referred to as a bottom surface, and the other sides are referred to as side surfaces.

As illustrated in FIG. 1 and FIG. 2, the circuit board 10 preferably includes a laminated body 11, external electrodes 12a to 12d and 14a to 14f, internal conductors 18a to 18d, 20a to 20f, and 22a and 22b, and via hole conductors b1 to b11. As illustrated in FIG. 2, the laminated body 11 preferably includes a laminate of rectangular or substantially rectangular insulating-material layers 16a to 16h made of a flexible material, for example, a thermoplastic resign, such as liquid crystal polymer. Thus, the laminated body 11 has preferably a rectangular or substantially rectangular parallelepiped shape. Hereinafter, a front surface of the insulating-material layers 16 refers to a main surface at the forward side in the z-axis direction, and a back surface of the insulating-material layers 16 refers to a main surface at the backward side in the z-axis direction.

The external electrodes 12 are preferably layers made of a conductive material, for example, copper, and provided on the top surface of the laminated body 11, as illustrated in FIG. 1. More specifically, the external electrodes 12 are provided near the approximate center (the intersection point of diagonals) of the front surface of the insulating layer 16a which is provided at the forward-most side in the z-axis direction. The external electrodes 12a and 12b are arranged along the y-axis direction. The external electrodes 12c and 12d are arranged along the y-axis direction at positions closer to the forward side in the x-axis direction than positions of external electrodes 12a and 12b. Moreover, the external electrodes 12 are categorized into two groups (groups G1 and G2). Specifically, the external electrodes 12a and 12b belong to the group G1. The external electrodes 12c and 12d belong to the group G2. The external electrodes 12 are arranged to be connected to an electronic component to be mounted on the top surface of the laminated body 11.

The internal conductors 18a to 18d are preferably a wiring layer made of a conductive material, for example, copper, and disposed in the laminated body 11, as illustrated in FIG. 2. Specifically, the internal conductors 18 are provided on the front surface of the insulating-material layer 16b. The internal conductors 18a to 18d are overlaid on the external electrodes 12a to 12d, respectively, when viewed in plan in the z-axis direction. In FIG. 2, only portions of the internal conductors 18 on which the external electrodes 12a to 12d are overlaid are shown, and illustration of the other portions is omitted.

The internal conductors 20a to 20f are preferably film-shaped conductors having relatively large areas, such as capacitor conductors and ground conductors, made of a conductive material, for example, copper, and are provided in the laminated body 11. The internal conductors 20a to 20f are provided on a plurality of insulating-material layers 16. Specifically, the internal conductors 20a and 20b are preferably arranged along the x-axis direction on the front surface of the insulating-material layer 16c. The internal conductors 20c and 20d are preferably arranged along the x-axis direction on the front surface of the insulating-material layer 16d. The internal conductors 20e and 20f are preferably arranged along the x-axis direction on the front surface of the insulating-material layer 16e.

Further, as illustrated in FIG. 4, the internal conductors 20a, 20c, and 20e are preferably overlaid on one another so as to coincide with one another and also overlaid on the external electrodes 12a and 12b that belong to the group G1 when viewed in plan in the z-axis direction. In this manner, the external electrodes 12a and 12b are overlaid on a plurality of internal conductors 20 when viewed in plan in the z-axis direction. In addition, when viewed in plan in the z-axis direction, the internal conductors 20a, 20c, and 20e are not connected to one another through via hole conductors in the regions where the internal conductors 20a, 20c, and 20e are overlaid on the external electrodes 12a and 12b.

The internal conductors 20b, 20d, and 20f are preferably overlaid on one another so as to coincide with one another and also overlaid on the external electrodes 12c and 12d that belong to the group G2 when viewed in plan in the z-axis direction. In this manner the external electrodes 12c and 12d are overlaid on a plurality of internal conductors 20 when viewed in plan in the z-axis direction. When viewed in plan in the z-axis direction, the internal conductors 20b, 20d, and 20f are not connected to one another through via hole conductors in the regions in which the internal conductors 20b, 20d, and 20f are overlaid on the external electrodes.

The internal conductors 22 are preferably wiring layers made of a conductive material, for example, copper, and provided in the laminated body 11, as illustrated in FIG. 2.

Specifically, the internal conductors 22a and 22b are provided on the front surfaces of the insulating-material layers 16f and 16g, respectively. In FIG. 2, only portions around end portions of the internal conductors 22 are shown, and illustration of the other portions are omitted.

The external electrodes 14 preferably include a layer made of a conductive material, for example, copper, and provided on the bottom surface of the laminated body 11. That is, the external electrodes 14 are provided on the back surface of the insulating-material layer 16h that is provided at the backward-most side in the z-axis direction. Further, the external electrodes 14a to 14c are arranged along the short side at the backward side in the x-axis direction on the bottom surface of the laminated body 11. The external electrodes 14d to 14f are arranged along the short side at the forward side in the x-axis direction on the bottom surface of the laminated body 11. In this manner, the external electrodes 12 and the external electrodes 14 are not overlaid on each other when viewed in plan view in the z-axis direction, as illustrated in FIG. 4. The external electrodes 14 are arranged to be connected to a printed wiring board to be mounted on the bottom surface of the laminated body 11.

As illustrated in FIG. 3, the laminated body 11 preferably includes a coil (circuit element) L and a capacitor (circuit element) C. The coil L is preferably defined by internal conductors (omitted in FIG. 2) and via hole conductors (not shown) which are provided on the front surfaces of the insulating-material layers 16d to 16g. The capacitor C is preferably defined by internal conductors (omitted in FIG. 2) provided on the front surfaces of the insulating-material layers 16f and 16g. As illustrated in FIG. 3, the internal conductors 20a, 20c, and 20e and the internal conductors 20b, 20d, and 20f are provided at positions upward from the center surface with respect to the z-axis direction.

The via hole conductors b1 to b11 connect the external electrodes 12 and 14, the internal conductors 18, 20, and 22, and the coil L and the capacitor C and are disposed so as to penetrate the insulating-material layers 16 in the z-axis direction. Specifically, as illustrated in FIG. 2, the via hole conductors b1 to b4 penetrate the insulating-material layer 16a in the z-axis direction to connect the external electrodes 12a to 12d to the internal conductors 18a to 18d, respectively.

The via hole conductor b5 penetrates the insulating-material layer 16f in the z-axis direction and is not overlaid on the external electrodes 12 when viewed in plan in the z-axis direction, as illustrated in FIG. 2. The via hole conductor b5 connects the internal conductor 22a to the internal conductor 22b. While FIG. 2 shows only the via hole conductor b5 as a via hole connecting the internal conductors 22 to each other, a via hole conductor other than the via hole conductor b5 to connect the internal conductors 22 to each other may also be present. However, any via hole conductor that connects the internal conductors 22 to each other is preferably not overlaid on the external electrodes 12.

As illustrated in FIG. 2, the via hole conductors b6 to b11 penetrate the insulating-material layer 16h in the z-axis direction and are not overlaid on the external electrodes 12 when viewed in plan in the z-axis direction. The via hole conductors b6 to b11 connect the internal conductors 22 provided on the insulating-material layers 16f and 16g to the external electrodes 14a to 14f, respectively.

By laminating the insulating-material layers 16a to 16h configured as described above, the circuit board 10 illustrated in FIG. 1 is obtained.

Figure 5:
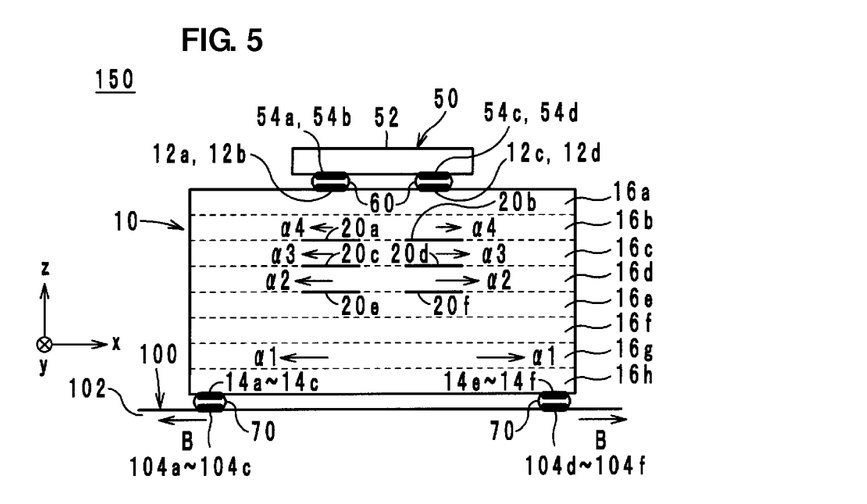
FIG. 5 is configuration diagram illustrating a module having the circuit board in FIG. 1.

FIG. 5 is a diagram illustrating a configuration of a module 150 including the circuit board 10. The module 150 preferably includes the circuit board 10, an electronic component 50, and a printed wiring board 100.

As illustrated in FIG. 5, the electronic component 50 is preferably a device, such as a semiconductor integrated circuit, for example, mounted on the circuit board 10. The electronic component 50 includes a main body 52 and external electrodes 54a to 54d. The main body 52 is preferably a rigid board defined by, for example, a semiconductor substrate. The external electrodes 54 are provided on a main surface at the rearward side in the z-axis direction (bottom surface) of the main body 52. The external electrodes 54a to 54d are preferably connected to the external electrodes 12a to 12d, respectively, by solder 60, for example. In this manner, the electronic component 50 is mounted on the top surface of the circuit board 10.

The printed wiring board 100 preferably includes a main body 102 and external electrodes 104a to 104f. The main body 102 is preferably a rigid board made of resin, for example. The external electrodes 104 are provided on a main surface at the forward side in the z-axis direction (top surface) of the main body 102. The external electrodes 104a to 104f are connected to the external electrodes 14a to 14f, respectively, preferably by a bonding agent, such as solder 70. In this manner, the circuit board 10 is mounted on the printed wiring board 100 via the bottom surface. The module 150 described above is mounted on an electronic device such as a mobile phone.

In the following, a manufacturing method of the circuit board 10 will be described with reference to the drawings. First, the insulating-material layers 16 each of which including copper foil formed over the entirety or substantially the entirety of one of the main surfaces are prepared. In each of the insulating-material layers 16a to 16g, the main surface on which the copper foil is formed is herein referred to as the front surface. On the other hand, in the insulating-material layer 16h, the main surface on which the copper foil is formed is herein referred to as the back surface.

Then, the positions at which the via hole conductors b1 to b5 of the insulating-material layers 16a and 16f are to be formed (see, FIG. 2) are irradiated with laser beams from the back surfaces, so that the via holes are formed. The positions at which the via hole conductor b6 to b11 of the insulating-material layer 16h are to be formed (see, FIG. 2) are irradiated with laser beams from the front surface, so that the via holes are formed. In addition, via holes may also be formed in the insulating-material layers 16b to 16e and 16g as necessary.

In the following, the external electrodes 12 illustrated in FIG. 2 are preferably formed on the front surface of the insulating-material layer 16a by photolithographic processes, for example. Specifically, resists having the same shapes as the external electrodes 12 illustrated in FIG. 2 are printed on the copper foil of the insulating-material layer 16a. Then, the copper foil is etched so that the copper foil on the portion which is not covered by the resists is removed. Then, the resist is removed. In this manner, the external electrodes 12 illustrated in FIG. 2 are formed on the front surface of the insulating-material layer 16a.

Then, the internal conductors 18 illustrated in FIG. 2 are preferably formed on the front surface of the insulating-material layer 16b by photolithographic processes. The internal conductors 20 illustrated in FIG. 2 are formed on the front surfaces of the insulating-material layers 16c to 16e by photolithographic processes, for example. The internal conductors 22 illustrated in FIG. 2 are formed on the front surfaces of the insulating-material layers 16f and 16g by photolithographic processes. The internal electrodes defining the coil L and the capacitor C illustrated in FIG. 3 (not shown in FIG. 2) are preferably formed on the front surfaces of the insulating-material layers 16d to 16g by photolithographic processes, for example. The external electrodes 14 illustrated in FIG. 2 are preferably formed on the back surface of the insulating-material layer 16h by photolithographic processes, for example. These photolithographic processes are similar to the photolithographic processes used when the external electrodes 12 are formed, and the description thereof will be omitted.

Then, the via holes formed in the insulating-material layers 16a, 16f, and 16h are filled with conductive paste preferably made primarily of copper, for example, so that the via hole conductors b1 to b11 are formed. If the via holes have been formed on the insulating-material layers 16b to 16e and 16g, these via holes are also filled with conductive paste.

Then, the insulating-material layers 16a to 16h are laminated in that order. By applying force to the insulating-material layers 16a to 16h from opposite directions in the lamination direction, the insulating-material layers 16a to 16h are press-bonded. In this manner, the circuit board 10 illustrated in FIG. 1 is obtained.

As will be described below, in the circuit board 10, even if the shape of the printed wiring board 100 is changed, the circuit board 10 can be prevented from being detached from the printed wiring board 100. More specifically, bending of the printed wiring board 600 may occur due to shock caused by dropping of an electronic device in which the conventional circuit board 500 and printed wiring board 600 are mounted. Since the circuit board 500 is a rigid board, in the case of bending of the printed wiring board 600, the shape of the circuit board 500 may not be significantly changed in accordance with the bending of the printed wiring board 600. Therefore, pressure is imposed on the solder connecting the external electrodes 502 and the external electrodes 602. As a result, the solder may be broken, and the circuit board 500 may be detached from the printed wiring board 600.

Thus, in the circuit board 10, the laminated body 11 preferably includes a laminate of insulating-material layers 16 made of a flexible material. Therefore, the circuit board 10 can be bent more easily than the circuit board 500. Therefore, even when the printed wiring board 100 is bent and the interval between the external electrodes 104 are changed due to dropping of an electronic device in which the module 150 illustrated in FIG. 5 is mounted, the intervals of the external electrodes 14 can also be changed by the deformation of the circuit board 10. As a result, pressure on the solder connecting the external electrodes 14 and the external electrodes 104 is effectively reduced or prevented, which prevents the circuit board 10 from being detached from the printed wiring board 100.

Further, in the circuit board 10, the electronic component 50 is prevented from being detached from the circuit board 10, as will be described below. More specifically, since the printed wiring board 800 disclosed in Japanese Unexamined Patent Application Publication No. 2006-93438 illustrated in FIG. 10 has flexibility over its entire surface, the entire printed wiring board 800 may be bent. Thus, the intervals between the external electrodes 803 may be changed. On the other hand, since the electronic component 700 includes a semiconductor substrate, the electronic component 803 cannot be significantly bent. Therefore, pressure is imposed on the external electrodes 702 and 803 and the solder connecting therebetween. As a result, the solder may be broken and the external electrodes 702 and 803 may be detached from the main bodies 701 and 801. That is, the electronic component 700 and the printed wiring board 800 may be disconnected.

Accordingly, the circuit board 10 effectively prevents the electronic component 50 from being detached from the circuit board 10 by overlaying at least one of the internal conductors 18, 20, and 22 on the external electrodes 12 when viewed in plan in the z-axis direction. More specifically, when the printed wiring board 100 is bent in a convex manner, stresses are applied to the external electrodes 104 in directions indicated by arrows B, as illustrated in FIG. 5. The external electrodes 104 are connected to the external electrodes 14 via the solder 70. Further, the laminated body 11 has flexibility. Therefore, the external electrodes 14 receive stresses in the directions indicated by the arrows B in accordance with the displacement of the external electrodes 104. As a result, tensile stresses $\alpha 1$ are applied to the insulating-material layers 16e to 16h in the x-axis direction.

Note that the internal conductors 20 are preferably fabricated using metal foil, such as copper, for example, and the insulating-material layers 16 are preferably fabricated using thermoplastic resin, such as liquid crystal polymer, for example. Since the insulating-material layers 16 and the internal conductors 20 are simply press-bonded together, no chemical bonding is formed between the insulating-material layers 16 and the internal conductors 20. Thus, the insulating-material layers 16 and the internal conductors 20 can be displaced with respect to each other. Therefore, when the tensile stresses are generated in the insulating-material layers 16e to 16h, the insulating-material layer 16d is displaced with respect to the internal conductors 20e and 20f. Similarly, the insulating-material layer 16c is displaced with respect to the internal conductors 20c and 20d. Similarly, the insulating-material layer 16b is displaced with respect to the internal conductors 20a and 20b.

As described above, when displacement between the insulating-material layers 16 and the internal conductors 20 occurs, a force is not transmitted from the insulating-material layers 16 provided at the backward side in the z-axis direction to the insulating-material layers 16 provided at the forward side in the z-axis direction. Thus, tensile stresses $\alpha 2$ to $\alpha 4$ generated in the insulating-material layers 16d, 16c, and 16b are less than the tensile stresses $\alpha 1$ generated in the insulating-material layers 16e to 16h. More specifically, the magnitudes of the tensile stresses $\alpha 1$ to $\alpha 4$ progressively decrease in that order. Therefore, the tension in the x-axis direction generated in the insulating-material layers 16a to 16h progressively decreases in order from the backward side to the forward side in the z-axis direction. Accordingly, the external electrodes 12a and 12b provided on the front surface of the insulating-material layer 16a are not significantly displaced. As a result, the circuit board 10 prevents the electronic component 50 from being detached from the circuit board 10. In addition, even when one of the main surfaces of an internal conductor and one of the main surfaces of an insulating-material layer is strongly bonded together by, for example, anchor effect, as in the case between the insulating-material layer 16d and the internal conductor 20e and between the insulating-material layer 16c and the internal conductor 20c, it is possible to cause displacement in the other main surface of the internal conductor to relax the stresses $\alpha$ if internal conductors are present on multiple layers.

In particular, in the circuit board 10, a plurality of internal conductors 20 are overlaid on the external electrodes when viewed in plan in the z-axis direction. Thus, the tensile stresses generated in the insulating-material layers 16 are more effectively relaxed. As a result, the electronic component 50 is more effectively prevented from being detached from the circuit board 10.

Further, in the circuit board 10, when shock is applied on the printed wiring board 100 from the rearward side towards the forward side in the z-axis direction, the shock is prevented from being transmitted to the external electrodes 12. More specifically, the via hole conductors are more rigid than the insulating-material layers 16 since the via hole conductors are made of a conductive material. Therefore, when the via hole conductors connecting the internal conductors 18, 20, and 22 are overlaid on the external electrodes 12 when viewed in plan in the z-axis direction, the shock may be transmitted from the external electrodes 12 through the via hole conductors.

Accordingly, in the circuit board 10, the via hole conductor b5 connecting the internal conductors 22 to each other is preferably not overlaid on the external electrodes 12 when viewed in plan in the z-axis direction, and the internal conductors 20 are not connected to one another in the region in which the internal conductors 20 are overlaid on the external electrodes 12, when viewed in plan in the z-axis direction. That is, the external electrodes 12, when viewed in plan in the z-axis direction, are preferably not overlaid on the via hole conductors other than the via hole conductors b1 to b4. Therefore, when shock is applied to the printed wiring board 100, the shock is not transmitted to the external electrodes 12 through the via hole conductors. As a result, when shock is applied to the printed wiring board 100 from the rearward side towards the forward side in the z-axis direction, the shock is prevented from being transmitted to the external electrodes 12.

Further, in the circuit board 10, when shock is applied to the printed wiring board 100 from the rearward side towards the forward side in the z-axis direction, the shock is prevented from being transmitted to the external electrodes 12 also for the reason described below. More specifically, shock from the printed wiring board 100 is transmitted to the laminated body 11 through the external electrodes 104, the solder 70, and the external electrodes 14. Thus, it is preferable that the external electrodes 12 be disposed as far as possible from the external electrodes 14. Accordingly, in the circuit board 10, the external electrodes 12 are disposed so as not to be overlaid on the external electrodes 14 when viewed in plan in the z-axis direction. In this manner, when shock is applied to the printed wiring board 100 from the rearward side towards the forward side in the z-axis direction, the shock is prevented from being transmitted to the external electrodes 12. To achieve the effects described above, it is preferable that the internal conductors be disposed as close as possible to the external electrodes 12.

Figure 6:
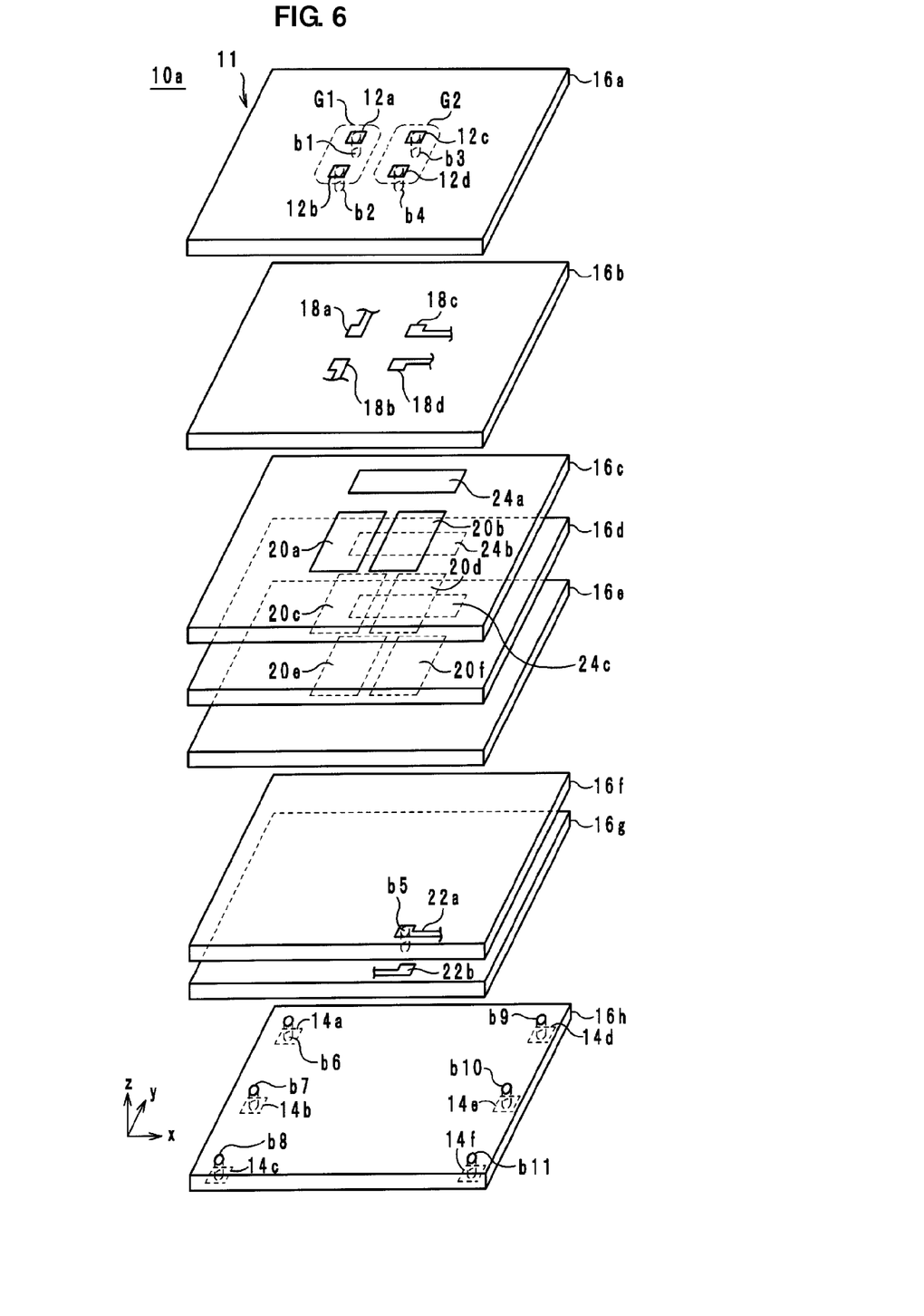
FIG. 6 is an exploded perspective view of a circuit board according to a first modified example of a preferred embodiment of the present invention.

In the following, a circuit board 10a according to a first modified example of a preferred embodiment of the present invention will be described with reference to the drawing. FIG. 6 is an exploded perspective view of the circuit board 10a according to the first modified example.

The circuit board 10a is different from the circuit board 10 in that it preferably includes internal conductors (auxiliary conductors) 24a to 24c. More specifically, the internal conductor 24a is preferably provided on the front surface of the insulating-material layer 16c provided with the internal conductors 20a and 20b, along the direction in which the internal conductors 20a and 20b are arranged, i.e., the x-axis direction. Similarly, the internal conductor 24b is preferably provided on the front surface of the insulating-material layer 16d provided with the internal conductors 20c and 20d, along the direction in which the internal conductors 20c and 20d are arranged, i.e., x-axis direction. Similarly, the internal conductor 24c is preferably provided on the front surface of the insulating-material layer 16e provided with the internal conductors 20e and 20f, along the direction in which the internal conductors 20e and 20f are arranged, i.e., x-axis direction.

The internal conductors 24 provided as described above make it difficult for the insulating-material layers 16 to be stretched in the direction in which the internal conductors 20 are arranged (x-axis direction). As a result, even if the shape of the printed wiring board 100 is changed, the external electrodes 12a and 12b provided on the front surface of the insulating-material layer 16a are not significantly displaced. As a result, the circuit board 10a more effectively prevents the electronic component 50 from being detached from the circuit board 10a.

Figure 7:
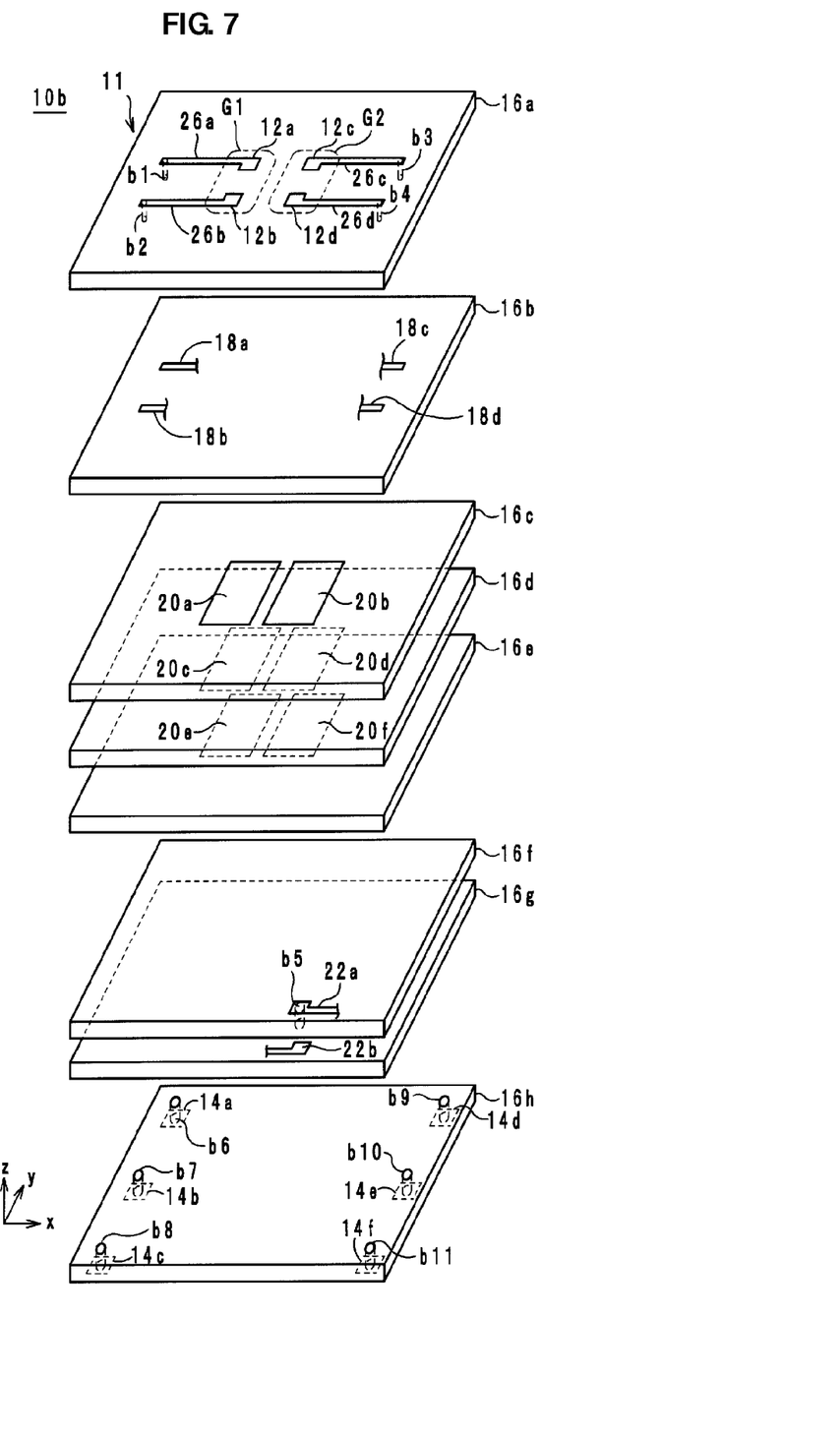
FIG. 7 is an exploded perspective view of a circuit board according to a second modified example of a preferred embodiment of the present invention.

In the following, a circuit board 10b according to a second modified example of a preferred embodiment of the present invention will be described with reference to the drawing. FIG. 7 is an exploded perspective view of the circuit board 10b according to the second modified example.

The circuit board 10b is different from the circuit board 10 in that it preferably includes external conductors 26a to 26d. More specifically, the external conductors 26a to 26d are preferably connected to the external electrodes 12a to 12d, respectively. The via hole conductors b1 to b4 are preferably connected to the external conductors 26a to 26d, respectively. With this arrangement, the external electrodes 12a to 12d are not overlaid on the via hole conductor b1 to b4 when viewed in plan in the z-axis direction. As a result, when a shock is applied to the printed wiring board 100 from the rearward side towards the forward side in the z-axis direction, the shock is more effectively prevented from being transmitted to the external electrodes 12.

Figure 8:
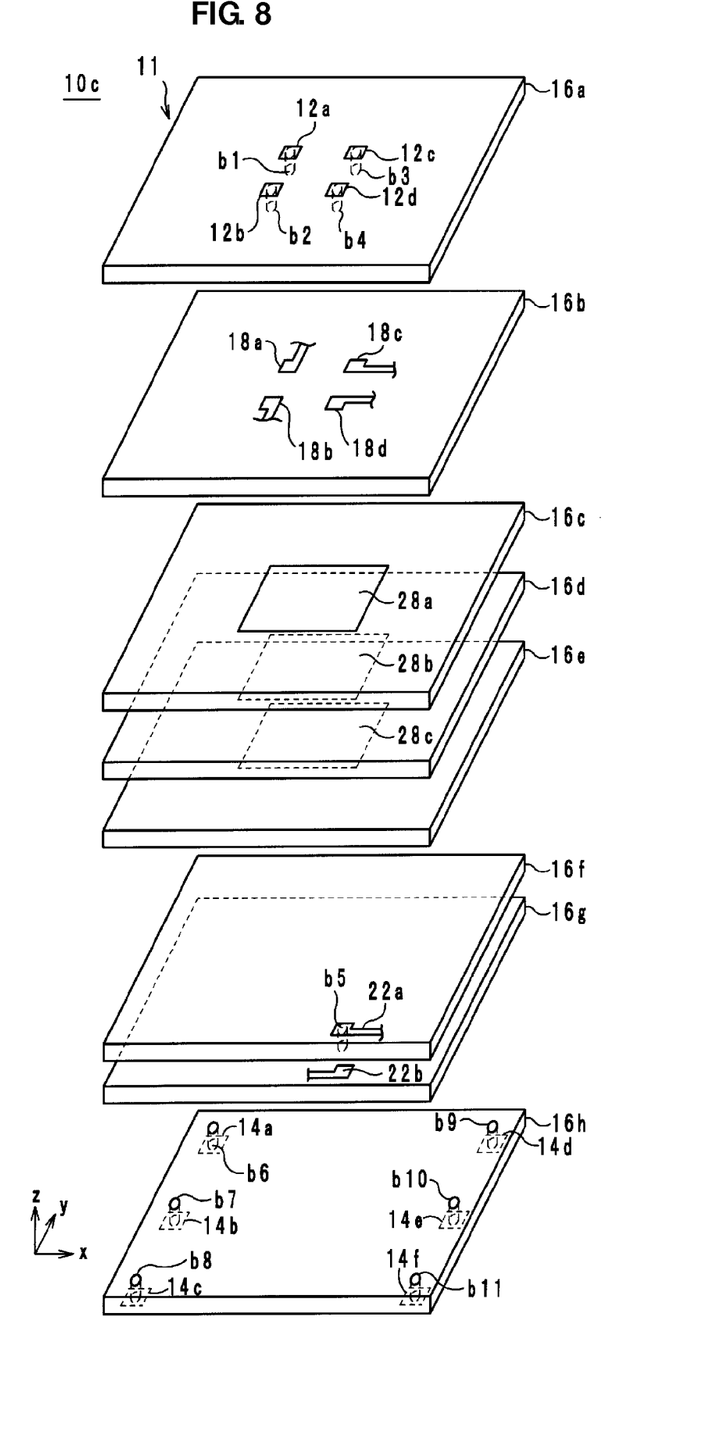
FIG. 8 is an exploded perspective view of a circuit board according to a third modified example of a preferred embodiment of the present invention.

In the following, a circuit board 10c according to a third modified example of a preferred embodiment of the present invention will be described with reference to the drawings. FIG. 8 is an exploded perspective view of the circuit board 10c according to the third modified example.

The circuit board 10c is different from the circuit board 10 in that internal conductors 28a to 28c are preferably provided in place of the internal conductors 20a to 20f. More specifically, the internal conductor 28a is preferably provided on the front surface of the insulating-material layer 16c and is overlaid on the external electrodes 12a to 12d when viewed in plan in the z-axis direction. Similarly, the internal conductor 28b is preferably provided on the front surface of the insulating-material layer 16d and is overlaid on the external electrodes 12a to 12d when viewed in plan in the z-axis direction. The internal conductor 28c is preferably provided on the front surface of the insulating-material layer 16e and is overlaid on the external electrodes 12a to 12d when viewed in plan in the z-axis direction. Similarly to the circuit board 10, the circuit board 10c having the above configuration also prevents the electronic component 50 from being detached from the circuit board 10c.

Figure 9:
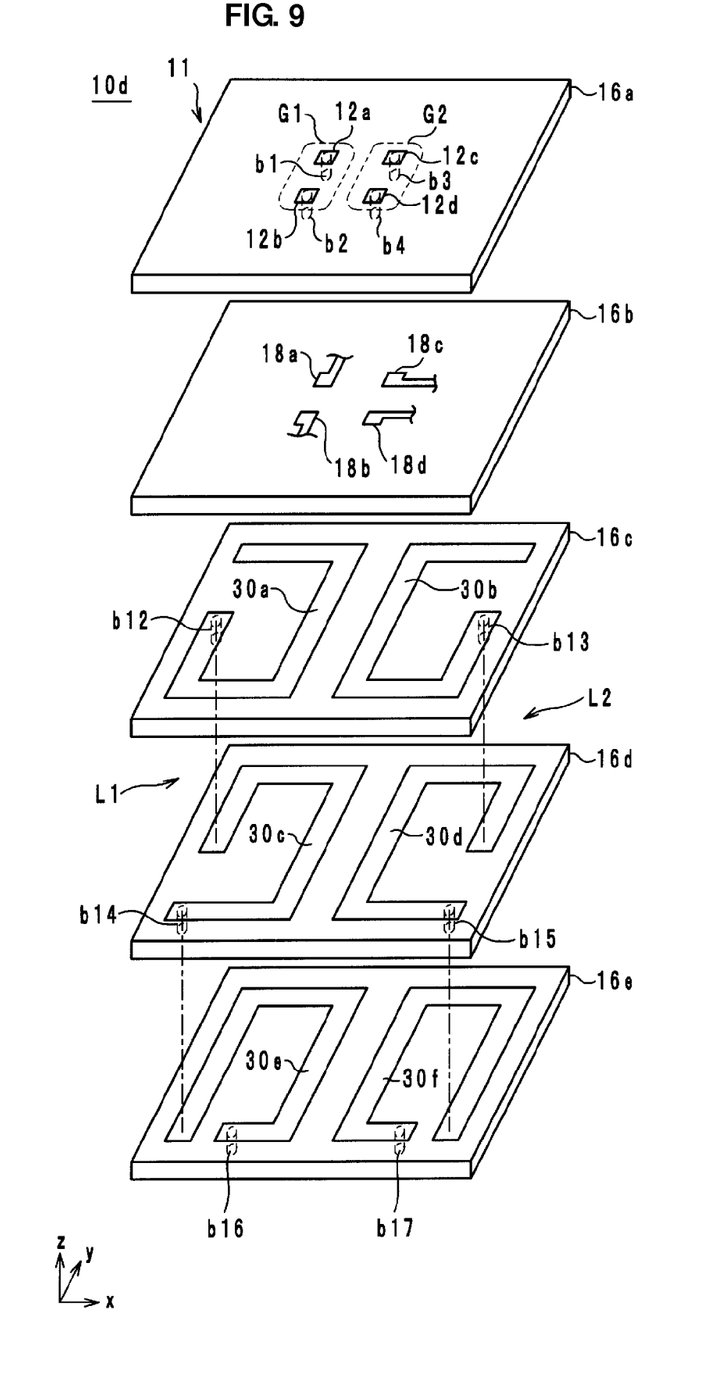
FIG. 9 is an exploded perspective view of a circuit board according to a fourth modified example of a preferred embodiment of the present invention.

In the following, a circuit board 10d according to a fourth modified example of a preferred embodiment of the present invention will be described with reference to the drawings. FIG. 9 is an exploded perspective view of the circuit board 10d according to the fourth modified example. FIG. 9 illustrates the insulating-material layers 16a to 16e. The insulating-material layers 16f to 16h of the circuit board 10d are the same or substantially the same as the insulating-material layers 16f to 16h of the circuit board 10 illustrated in FIG. 2, and the description thereof will be omitted.

The circuit board 10d is different from the circuit board 10 in that it is preferably provided with internal conductors 30a to 30f and via hole conductors b12 to b17 in place of the internal conductors 20a to 20f. More specifically, the internal conductors 30a and 30b are preferably provided on the front surface of the insulating-material layer 16c to define a 7/8-turn coil conductor. Further, the internal conductor 30a is overlaid on the external electrodes 12a and 12b when viewed in plan in the z-axis direction. The internal conductor 30b is overlaid on the external electrodes 12c and 12d when viewed in plan in the z-axis direction. The internal conductors 30c and 30d are preferably provided on the front surface of the insulating-material layer 16d to define a 7/8 coil conductor. Further, the internal conductor 30c is overlaid on the external electrodes 12a and 12b when viewed in plan in the z-axis direction. The internal conductor 30d is overlaid on the external electrodes 12c and 12d when viewed in plan in the z-axis direction. The internal conductors 30e and 30f are preferably provided on the front surface of the insulating-material layer 16e to define a 7/8 coil conductor. Further, the internal conductor 30e is overlaid on the external electrodes 12a and 12b when viewed in plan in the z-axis direction. The internal conductor 30f is overlaid on the external electrodes 12c and 12d when viewed in plan in the z-axis direction.

Each of the via hole conductors b12 and b13 preferably penetrates the insulating-material layer 16c in the z-axis direction to connect ends of the internal conductors 30a and 30b to ends of the internal conductors 30c and 30d. Similarly, each of the via hole conductors b14 and b15 preferably penetrates the insulating-material layer 16d to connect ends of the internal conductors 30c and 30d to ends of the internal conductors 30e and 30f. Each of the via hole conductors b16 and b17 preferably penetrates the insulating-material layer 16e and are connected to ends of the internal conductors 30e and 30f. In this manner, the internal conductors 30a, 30c, and 30e and the via hole conductors b12, b14, and b16 define a coil L1. The internal conductors 30b, 30d, and 30f and the via hole conductors b13, b15, and b17 define a coil L2.

As described above, similarly to the circuit board 10, by using the internal conductors 30, which define coil conductors, instead of the internal conductors 20, which define capacitor conductors or ground conductors, detachment of the electronic component 50 from the circuit board 10d is effectively prevented. While the internal conductors 30 preferably define coil conductors, the internal conductors 30 may be simple wiring conductors which do not define coils.

In the circuit boards 10 and 10a to 10d, the external electrodes 14 are preferably provided on the bottom surface of the laminated body 11. However, the external electrodes 14 may be provided on a side surface.

In the circuit boards 10 and 10a to 10d, the external electrodes 14 are not necessarily provided. Specifically, each of the circuit boards 10 and 10a to 10d may be bonded on a casing instead of being mounted on the printed wiring board 100. In this case, the external electrodes 14 are not necessary in the circuit boards 10 and 10a to 10d.

Preferred embodiments of the present invention are practicable in a circuit board. In particular, preferred embodiments of the present invention are advantageous to effectively prevent an electronic component from being detached from a circuit board.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A circuit board comprising:
   a flexible laminated body including a laminate of a plurality of insulating-material layers made of thermoplastic resin;
   a via hole conductor provided in the flexible laminated body; and
   a film-shaped conductor made of a metal foil and provided on a first insulating-material layer of the plurality of insulating-material layers; wherein
   the via hole conductor is overlapped with the film-shaped conductor when viewed in a lamination direction of the flexible laminated body;
   the via hole conductor is provided in an area of a second insulating-material layer of the plurality of insulating-material layers above the film-shaped conductor and is spaced away from all edges of the film-shaped conductor;
   the film-shaped conductor is not connected to the via hole conductor; and
   the film-shaped conductor is not chemically bonded to any of the plurality of insulating-material layers so that the film-shaped conductor is displaced with respect to a third insulating-material layer of the plurality of insulating-material layers which is arranged between the film-shaped conductor and the via hole conductor when tensile stresses are generated in the plurality of insulating-material layers.

2. The circuit board according to claim 1, wherein the film-shaped conductor is provided closer to a top surface of the flexible laminated body than a central area of the flexible laminated body in the lamination direction of the flexible laminated body.

3. The circuit board according to claim 1, wherein
   the via hole conductor includes a plurality of via hole conductors; and
   the film-shaped conductor is not connected to any of the plurality of via hole conductors.

* * * * *